United States Patent [19]

Wada et al.

[11] 4,297,601
[45] Oct. 27, 1981

[54] MONOSTABLE MULTIVIBRATOR CIRCUIT AND FM DETECTOR CIRCUIT EMPLOYING PREDETERMINED LOAD RESISTANCE AND CONSTANT CURRENT TO INCREASE RESPONSE RATE OF DIFFERENTIAL TRANSISTOR PAIR

[75] Inventors: Takeshi Wada, Kodaira; Yasuo Kominami, Kokubunji; Yukihiko Miyamoto; Tsuneo Yamada, both of Tokyo, all of Japan

[73] Assignees: Hitachi, Ltd.; Trio Kabushiki Kaisha, both of Tokyo, Japan

[21] Appl. No.: 3,962

[22] Filed: Jan. 16, 1979

[30] Foreign Application Priority Data

Mar. 15, 1978 [JP] Japan ................... 53/28663

[51] Int. Cl.$^3$ .................... H03K 5/12; H03K 3/284
[52] U.S. Cl. ................... 307/555; 307/273; 307/280
[58] Field of Search ............ 307/254, 273, 280, 237

[56] References Cited

U.S. PATENT DOCUMENTS

| | | | |
|---|---|---|---|
| 3,124,706 | 3/1964 | Alexander | 307/273 X |
| 3,143,658 | 8/1964 | Woods et al. | 307/273 X |
| 3,755,693 | 8/1973 | Lee | 307/280 X |
| 3,828,206 | 8/1974 | Zuk | 307/280 X |
| 3,883,756 | 5/1975 | Dragon | 307/273 X |
| 4,009,404 | 2/1977 | Kuo | 307/273 |

*Primary Examiner*—John S. Heyman
*Attorney, Agent, or Firm*—Craig and Antonelli

[57] ABSTRACT

A monostable multivibrator circuit is disclosed. It is characterized by comprising a time constant circuit which includes a capacitor, an amplifier circuit which receives an output signal of the time constant circuit and in which a signal amplifying transistor operates in the non-saturated state, a positive feedback circuit which is connected between the output end of the amplifier circuit and the input end of the time constant circuit and in which a signal amplifying transistor operates in the non-saturated state, and a trigger terminal which is disposed in a circuit loop constructed of the time constant circuit, the amplifier circuit and the positive feedback circuit. Further, it is characterized in that a signal which is produced by the shift from the non-conductive state to the conductive state of the signal amplifying transistor connected to an output terminal of the positive feedback circuit is supplied to the time constant circuit as a positive feedback signal.

5 Claims, 11 Drawing Figures

MONOSTABLE MULTIVIBRATOR CIRCUIT AND FM DETECTOR CIRCUIT EMPLOYING PREDETERMINED LOAD RESISTANCE AND CONSTANT CURRENT TO INCREASE RESPONSE RATE OF DIFFERENTIAL TRANSISTOR PAIR

BACKGROUND OF THE INVENTION

This invention relates to a monostable multivibrator circuit in which a signal amplifying transistor operates in a non-saturated state, and also to an FM detector circuit which employs the monostable multivibrator circuit.

A monostable multivibrator circuit usually has a time constant circuit which uses a capacitor, an amplifier circuit which has an input threshold voltage and which is connected to the output end of the time constant circuit, a positive feedback circuit which is connected between the output end of the amplifier circuit and the input end of the time constant circuit, and a trigger terminal which is disposed in a predetermined portion of the circuit loop.

As regards a signal amplifying transistor used in the amplifier circuit or the positive feedback circuit, when the collector-emitter voltage has fallen below the saturation voltage, the current gain drops, and the change of the collector current responsive to the change of an input signal diminishes. Therefore, it becomes impossible to bestow a driving current of an abrupt change on a load connected to the transistor, and the rectangular waveform of an output signal from the circuit becomes rounded or obtuse. On account of the saturation, carriers are accumulated in the collector region and base region of the transistor. The accumulated carriers cause a comparatively long delay time in the output signal.

It is desirable that the obtuseness of the signal waveform as stated above be less and that the delay time be shorter.

In, for example, the so-called pulse count detector circuit wherein a pulse signal of a duty ratio corresponding to the frequency of an FM (frequency-modulated) signal is formed by the monostable multivibrator circuit and is smoothed thereby to obtain a demodulated signal, if the pulse signal is obtuse, the demodulated signal will not attain a level corresponding exactly to the particular duty ratio. If the delay time is long, the repeated operation of short periods will be hindered, and there will be no response to an FM signal at a high frequency.

SUMMARY OF THE INVENTION

It is accordingly an object of this invention to provide a monostable multivibrator circuit which presents a favorable output waveform and which exhibits a high response rate.

Another object of this invention is to provide a monostable multivibrator circuit which is suited to a pulse count detector circuit.

Another object of this invention is to provide a monostable multivibrator circuit which is suitably assembled in, for example, a semiconductor linear integrated circuit.

Still another object of this invention is to provide an FM detector circuit which employs a monostable multivibrator circuit.

In this invention, the collector potential of a signal amplifying transistor used in the monostable multivibrator circuit has its lowest value limited so as to be higher than the base potential thereof. That is, the signal amplifying transistor is limited so as to operate in the non-saturated region. As a result, the change of a signal to be delivered at the collector of the signal amplifying transistor which is restricted by stray capacitances existing in the collector such as collector capacitance and wiring capacitance is not affected by the lowering of the current gain or the accumulation of the carriers which results from the fact that the collector-emitting voltage has fallen below the saturation voltage.

In order to limit the lowest value of the collector potential as described above, a clamp circuit is connected to the collector of the signal amplifying transistor. In case of using the clamp circuit in this manner, the collector current of the transistor is given a magnitude greater than that of a current flowing through a collector load resistor, so that the rising and falling rates of an output signal become different. More specifically, the rise and the fall of the output signal are respectively determined by the charging rate of the stray capacitances owing to the current flowing from the collector load resistor during the turn-off of the transistor and by the discharging rate of the stray capacitances owing to the collector current of the transistor during the turn-on of the transistor. Since, in this case, the collector current during the turn-on is made greater than the current flowing through the collector load resistor as stated above, the discharging rate is higher than the charging rate. Accordingly, the falling rate of the signal is higher than the rising rate thereof.

In case where the clamp circuit as set forth above is not employed, the amplitude of the signal to appear across the collector load resistor is determined by the collector current of the transistor, which in turn is a constant current decided by the base current of the transistor, so that the charging rate and the discharging rate for the stray capacitances are substantially equal.

In case of operating the monostable multivibrator circuit in short recurrence periods, the reset time must be quickened. The period of generation of the output signal is controlled by the period of time during which an output signal from a time constant circuit exceeds the input threshold voltage of an amplifier circuit.

In this invention, the signal amplifying transistor of the non-saturated operation which is connected to an output terminal of a positive feedback circuit turns from the non-conductive state to the conductive state when a trigger signal is entered. By disposing the positive feedback circuit of the foregoing arrangement on the input side of the time constant circuit, a monostable multivibrator circuit can be obtained which fully exploits the aforecited desirable properties exhibited by the signal amplifying transistor of the non-saturated operation.

In an improvement according to this invention, the signal amplifying transistor constitutes a differential amplifier circuit, with the result that the monostable multivibrator circuit operates stably for various bias voltages. This construction is suited to an IC.

The output of the positive feedback circuit is applied to the time constant circuit through a buffer amplifier circuit which is composed of emitter-follower transistors. Since the buffer amplifier circuit has a low output impedance, the reset time of the monostable multivibrator circuit shortens.

This invention will now be described with reference to the accompanying drawings.

DESCRIPTION OF THE PREFERRED EMBODIMENT

Figure 1:
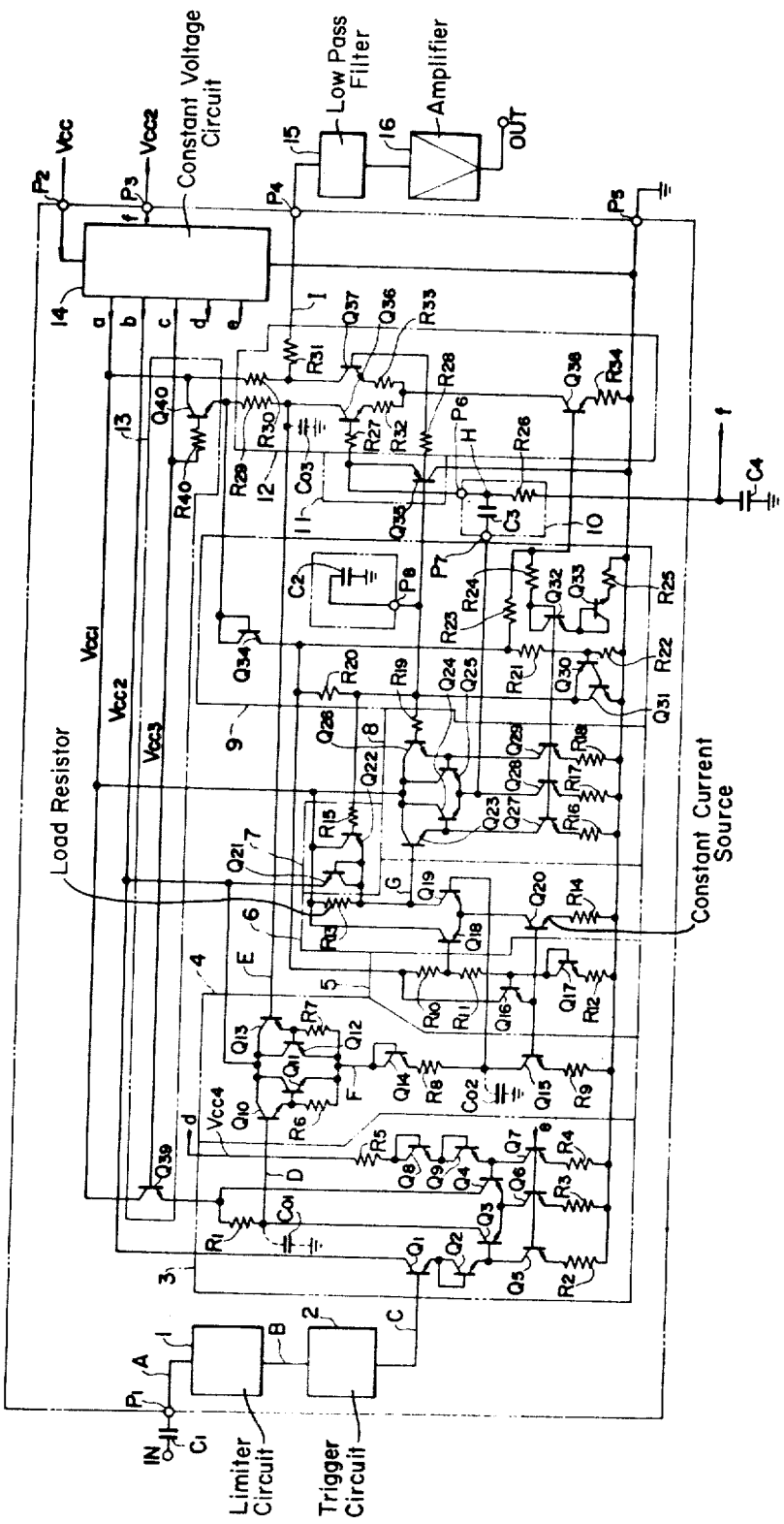
FIG. 1 is a circuit diagram showing an embodiment in the case where a monostable multivibrator in this invention is applied to an FM detector circuit of the pulse count system.

Hereunder, an embodiment will be described. The monostable multivibrator circuit of this invention is especially suitable for the pulse count detector circuit as previously stated which produces an analog signal from a pulse signal. Accordingly, an embodiment of this invention applied to the pulse count detector circuit will be explained with reference to FIG. 1.

Referring to the figure, numeral 1 designates a limited circuit, numeral 2 a trigger signal forming circuit, numeral 3 a buffer amplifier circuit which executes an amplitude limiting operation, and numeral 4 a signal combining circuit. Numerals 5 and designate bias supplying circuits, and numerals 6 and 12 differential amplifier circuits. Numeral 7 indicates a level clamp circuit, numeral 8 a differentiator driver and level clamp circuit, numeral 10 a time constant circuit, and numeral 11 a differentiator output clamp circuit. Shown at 13 and 14 are constant-voltage circuits. Voltages $V_{CC1}$, $V_{CC2}$ and $V_{CC3}$ at respective output terminals a, b and c of the constant-voltage circuit 14 are qualified by the relationship of $V_{CC1} > V_{CC2} > V_{CC3}$.

In the above, the circuits 4 to 12 constitute the monostable multivibrator circuit.

A portion enclosed with a one-dot chain line in the figure is put into a semiconductor integrated circuit (IC). $P_1$ to $P_5$ represent external terminals of the IC.

Signal waveforms at positions A to I in the circuit are respectively illustrated in FIGS. 2A to 2I.

An FM signal which has been broadcast and received and which has been converted into an intermediate frequency of comparatively low frequency is applied to the terminal $P_1$ through a terminal IN as well as a coupling capacitor $C_1$.

Figure 2:
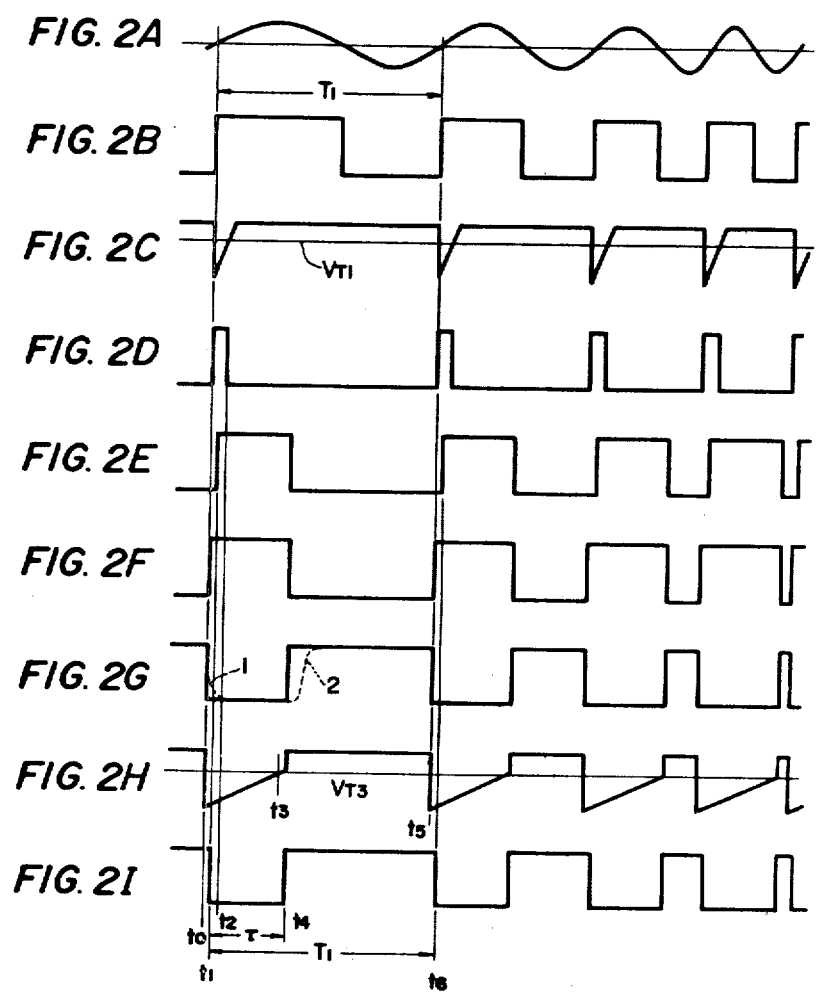
FIGS. 2A to 2I are diagrams of operating waveforms in the embodiment of this invention shown in FIG. 1.

This FM signal is waveform-shaped by the limiter circuit 1 in order to obtain a trigger signal later. The limiter circuit 1 amplifies the input FM signal shown in FIG. 2A, and limits the amplitude of the amplified signal. As illustrated in FIG. 2B, the output signal of the limiter circuit 1 becomes a substantially rectangular signal waveform having the same periods as those of the input FM signal.

The trigger signal forming circuit 2 includes, for example, a waveform shaping circuit composed of resistors and capacitors and an amplifier circuit (neither is shown in the figure). In response to the input rectangular wave signal in FIG. 2B, it provides the trigger signal in synchronism with the rise of the input signal. The output signal waveform of the circuit 2 assumes the shape illustrated in FIG. 2C.

The trigger signal is applied to the buffer amplifier circuit 3. In the buffer amplifier circuit 3, transistors $Q_5$ to $Q_7$ operate as constant-current transistors owing to a base bias voltage fed from the constant-voltage circuit 14.

The trigger signal is applied to the base of one differential transistor $Q_3$ through an emitter follower transistor $Q_1$, and a level shifting transistor in the diode connection $Q_2$ which are connected in series. The quantity of level shift by the transistors $Q_1$ and $Q_2$ is constant because their emitter currents are fixed by the transistor $Q_5$.

An output voltage $V_{CC4}$ of the constant-voltage circuit 14 is applied to the base of the other differential transistor $Q_4$ through a resistor $R_5$ and diode-connected transistors $Q_8$ and $Q_9$ which are connected in series.

The base potential $V_{T1}$ of the other differential transistor $Q_4$ is set at an intermediate value in the level variation range of the trigger signal which is applied to the one differential transistor $Q_3$. The one differential transistor $Q_3$ conducts the "on-off" operation with its threshold voltage being the potential $V_{T1}$.

In response to the input trigger signal shown in FIG. 2C, accordingly, the buffer amplifier circuit 3 provides an inverted signal which is waveform-shaped into a fixed amplitude and duration as illustrated in FIG. 2D.

The trigger signal subjected to the waveform shaping and a feedback signal from the differential amplifier circuit 12 are applied to the signal combining circuit 4.

Transistors $Q_{10}$ and $Q_{11}$ and transistors $Q_{12}$ and $Q_{13}$ of the signal combining circuit 4 are Darlington connected, respectively. The emitters of the transistors $Q_{11}$ and $Q_{12}$ are connected in common, and are connected to the collector of a constant-current transistor $Q_{15}$ through a level shifting transistor in the diode connection $Q_{14}$ and a resistor $R_8$.

The transistors $Q_{10}$ and $Q_{11}$ and those $Q_{13}$ and $Q_{12}$ in the Darlington connections operate as a kind of switching element for two input signals owing to the common connection of the emitters. The potential of the emitters connected in common corresponds to a higher one of the base potentials of the transistors $Q_{10}$ and $Q_{13}$. The transistors in the Darlington connection operate also as a level shift circuit. The quantity of level shift which occurs between the base and the common emitter of the Darlington-connected transistors in the "on" state is equal to the sum of the base-emitter forward voltages of the two transistors. In this case, the emitter current is made constant by the constant-current transistor $Q_{15}$, and hence, the base-emitter forward voltage is constant. Accordingly, the aforecited quantity of level shift is constant irrespective of the level of the input signal applied to the base of the Darlington-connected transistor.

In the circuit of FIG. 1, the signal shown in FIG. 2D is applied to the base of the Darlington-connected transistor $Q_{10}$, and the feedback signal shown in FIG. 2E is applied to the base of the transistor $Q_{13}$. Therefore, a composite signal shown in FIG. 2F appears at the common-connection emitters. In this case, both the supply voltage of the buffer amplifier circuit 3 and the supply voltage of a transistor $Q_{36}$ in the differential amplifier circuit 12 have a value which is determined by the base voltages $V_{CC3}$ of the emitter-follower transistors $Q_{39}$ and $Q_{40}$, so that the high levels of the two signals to be combined in the combining circuit 4 are equal. Accordingly, the high level of the composite signal becomes a constant value which scarcely includes a fluctuating component.

As will be understood later, the monostable multivibrator circuit of this embodiment is triggered by the leading edge of the composite signal. Since, in this case, the composite signal scarcely includes a fluctuating component as stated above, the circuit operates stably.

The composite signal is applied to the differential amplifier circuit 6 through a lever shift circuit which consists of the diode-connected transistor $Q_{14}$ and the resistor $R_8$. The differential amplifier circuit 6 consists of differential transistors $Q_{18}$ and $Q_{19}$, a constant-current transistor $Q_{20}$ and a load resistor $R_{13}$, and it inverts and amplifies the entered composite signal. An output signal at an output terminal of the differential amplifier circuit 6 has its high level and low level limited by the clamp circuit 7. Since, in the clamp circuit 7, the emitter of a transistor $Q_{21}$ is connected to the output terminal b of the constant-voltage circuit 14, the high level $V_{CLH}$ is determined by the voltage $V_{CC2}$ and the base-emitter forward voltage of the transistor $Q_{21}$. Since the base of a transistor $Q_{22}$ receives a constant voltage from the bias supplying circuit 9 through a resistor of comparatively small resistance $R_{15}$, the low level $V_{CLL}$ is determined by the constant voltage and the base-emitter forward voltage of the transistor $Q_{22}$. The voltage $V_{CC2}$ has a value lower than the supply voltage $V_{CC1}$ of the differential amplifier circuit 6. The low clamp level owing to the transistor $Q_{22}$ is made a comparatively high level lest the collector potential of the differential transistor $Q_{19}$ should become lower than the base potential thereof.

Figure 3:
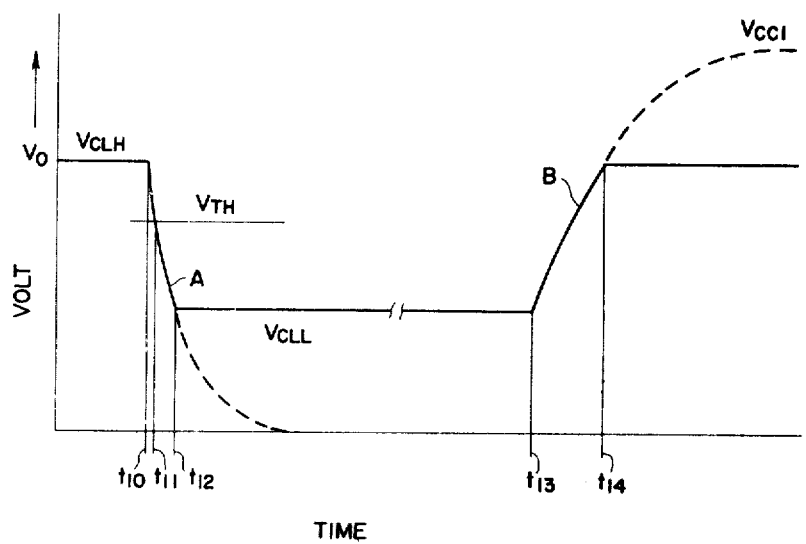
FIG. 3 is a diagram for explaining an operating waveform in detail.

The change of an output signal $V_o$ from the differential amplifier circuit 6 is illustrated in FIG. 3. At a time $t_{10}$, the transistor $Q_{19}$ is turned from the non-conductive state to the conductive state by the input signal thereof. Then, the collector current I of the constant-current transistor $Q_{20}$ begins to flow to the transistor $Q_{19}$, and the potential of an output terminal G begins to lower from the high clamp potential $V_{CLH}$. At this time, letting R denote the resistance of the collector load resistance $R_{13}$ and C denote an output capacitance (not shown) at the terminal G, the output signal $V_o$ becomes as given by the following equation (1):

$$V_o = V_{CLH} - R \cdot I(1 - e^{-t/CR}) \quad (1)$$

The change of Equation (1) continues until the output signal $V_o$ reaches the low clamp potential $V_{CLL}$.

Conversely, when the transistor $Q_{19}$ has turned from the conductive state to the non-conductive state, the output capacitance having been at the potential $V_{CLL}$ is charged through the resistor $R_{13}$ by the power supply $V_{CC1}$. Therefore, the output voltage $V_o$ changes as given by the following equation (2):

$$V_o = V_{CLL} + (V_{CC1} - V_{CLL})(1 - e^{-t/CR}) \quad (2)$$

The change of Equation (2) continues from a time $t_{13}$ to a time $t_{14}$.

The value of R·I in Equation (1) is made greater than that of $(V_{CC1} - V_{CLL})$ in Equation (2) so as to determine the low clamp level $V_{CLL}$. In FIG. 3, accordingly, the falling rate of the signal is higher than the rising rate thereof.

The differential amplifier circuit 6 provides an inverted signal as shown in FIG. 2G at its output terminal in response to the input signal shown in FIG. 2F.

The differential transistor $Q_{19}$ operates in the non-saturated state because the lower limit of its collector potential is set by the clamp circuit 7. Accordingly, it operates at a high speed. In contrast, in case where the lower limit of the collector potential is not set, the transistor $Q_{19}$ will operate in the saturated state when the collector potential has become lower than the base potential in response to the input signal. Since the current gain of the transistor becomes small in the saturated state, the output signal waveform will become rounded as indicated by a broken line 1 in FIG. 2G. Besides, it lags as indicated by a broken-line curve 2 in FIG. 2G on account of the accumulation of carriers in the base and the collector.

The output signal of the differential amplifier circuit 6 is applied to the differentiator driver circuit which has emitter-follower transistors $Q_{23}$ and $Q_{24}$ in the Darlington connection. The differentiator driver circuit has a clamp circuit which is composed of transistors $Q_{25}$ and $Q_{26}$. The lower-limit level of the emitter potential of the transistor $Q_{24}$ is limited by this clamp circuit.

An output signal from the buffer amplifier circuit 8 is applied through an external terminal $P_7$ to the time constant circuit 10 which is composed of a capacitor $C_3$ and a resistor $R_{26}$. An output signal from the time constant circuit is applied to the differential amplifier circuit 12 through an external $P_6$ as well as the differentiator output clamp circuit 11.

One end of the resistors $R_{26}$ of the time constant circuit 10 is connected to a smoothing capacitor $C_4$ and an output terminal f of the constant-voltage circuit 14. In the stable state of the monostable multivibrator circuit, the base-emitter path of a p-n-p transistor $Q_{35}$ of the differentiator output clamp circuit 11 is forward biased by a current from the resistor $R_{26}$. Accordingly, the emitter potential of the transistor $Q_{35}$ is higher than the base potential thereof. Owing to the aforecited potentials of the differentiator output clamp circuit 11, a transistor $Q_{36}$ of the differential amplifier circuit 12 is in the "on" state and a transistor $Q_{37}$ thereof is in the "off" state. The low level of the collector potential of each of the transistors $Q_{36}$ and $Q_{37}$ is made higher than the base potential thereof by a limited current from a constant-current transistor $Q_{38}$.

The time constant circuit 10 provides a signal shown in FIG. 2H, and the differential amplifier circuit 12 delivers a signal shown in FIG. 2I to its output terminal I.

The collector of the transistor $Q_{37}$ of the differential amplifier circuit 12 is especially connected through the load resistor $R_{30}$ to that output terminal a of the constant-voltage circuit 14 which provides the voltage $V_{CC1}$ still higher than the voltages $V_{CC2}$ and $V_{CC3}$. Therefore, the resistance of the load resistance $R_{30}$ can be selected so as to operate the transistor $Q_{37}$ in the non-saturated state, and the amplitude of the output signal at the output terminal I can be made large. This makes it possible to easily supply a desired voltage to a circuit 15 which utilizes the detector circuit. Furthermore, this optimizes the operating condition of the transistor $Q_{36}$. More specifically, since the collector output voltage (the voltage at the terminal E) of the transistor $Q_{36}$ having the time constant circuit 10 as its input circuit may be a small voltage enough to drive a positive feedback circuit (for example, 1/10 of the voltage at the terminal I), the transistor $Q_{36}$ can be operated in a sufficiently unsaturated state. As a result, even when the base input voltage of the transistor $Q_{36}$ becomes high in the transient state at the turn-on of the transistor $Q_{36}$, it does not rise above the collector voltage of the transistor $Q_{36}$ and does not bring the transistor $Q_{36}$ into the saturated operation.

In this manner, it is very effective to derive the output voltage from the transistor $Q_{37}$ opposite to the transistor $Q_{36}$ having the time constant circuit 10 as its input circuit.

In the bias supplying circuit 9, a capacitor $C_2$ which is disposed between a terminal $P_8$ and an earth point of the circuit serves for smoothing.

In the arrangement described above, on the basis of the rise of the trigger signal shown in FIG. 2D which is applied to the base of the transistor $Q_{10}$ of the signal combining circuit 4, the input signal of the time constant circuit 10 falls at a time $t_0$, and the output signal thereof falls upon the decay of this input signal.

Owing to the output signal of the time constant circuit 10, the base potential of the transistor $Q_{36}$ of the differential amplifier circuit becomes lower than the base potential of the transistor $Q_{37}$, so that the transistor $Q_{36}$ changes from the "on" state to the "off" state and the transistor $Q_{37}$ from the "off" state to the "on" state. Accordingly, the collector potential of the transistor $Q_{36}$ becomes the high level. The potential of this high level is supplied to the combining circuit 4. In consequence of a feedback through the circuits 4, 6 and 8, the input signal of the time constant circuit 10 remains at the low level as long as the transistor $Q_{36}$ of the differential amplifier circuit 12 is in the "off" state.

The capacitor $C_3$ of the time constant circuit 10 is charged through the resistor $R_{26}$ from the constant-voltage circuit 14. Therefore, the potential of the output terminal of the time constant circuit 10 increases as shown in FIG. 2H according to a time constant thereof.

The base potential of the transistor $Q_{36}$ of the differential amplifier circuit 12 exceeds the base potential of the transistor $Q_{37}$ at a time $t_3$ owing to the output potential of the time constant circuit 10.

As a result, the transistor $Q_{36}$ returns to the "on" state again. Upon the increase of the collector potential of the transistor $Q_{36}$, the input signal of the time constant circuit 10 rises at a time $t_4$ through the circuits 4, 6 and 8.

Upon the rise of the input signal of the time constant circuit 10, the output signal thereof rises. In this case, the output signal is limited by the transistor $Q_{35}$ because the base-emitter path of the transistor $Q_{35}$ of the differentiator output clamp circuit 11 is forward-biased by this signal. Since the emitter terminal of the transistor $Q_{35}$ comes to exhibit a sufficiently low impedance, charges stored in the capacitor $C_3$ of the time constant circuit 10 are rapidly discharged through the transistor $Q_{35}$.

The monostable multivibrator circuit consisting of the circuits 4 to 12 conducts the same operation as above described in response to the next trigger signal.

In the circuit of FIG. 1, the monostable multivibrator circuit provides a pulse signal of a fixed duration as indicated in FIG. 2I every period of the FM signal shown in FIG. 2A.

This signal is impressed on the terminal $P_4$ and the low-pass filter circuit 15. A demodulated signal is obtained from the low-pass filter circuit 15. The demodulated signal is amplified by an amplifier circuit 16.

In this embodiment, the trigger signal and the feedback signal are combined through the emitter-follower transistors, so that the electrical interference between the feedback signal terminal and the trigger signal terminal decreases to a negligible extent. Since the trigger terminal receives only the signal from the buffer amplifier circuit 3 and this signal does not undergo any level change due to the interference, the signal stably triggers the monostable multivibrator even in a different trigger period. The feedback terminal receives only the signal from the differential amplifier circuit 12, and this signal is not interfered with from the trigger terminal etc. Accordingly, the differential amplifier circuit 12 does not cause any distortion ascribable to the interference of the trigger signal.

In contrast, in case where, for example, the trigger terminal is interfered with by the feedback terminal, the level of the trigger terminal is at the high level during the period during which the level of the feedback terminal is at the high level, and it attains the low level when the feedback terminal has attained the low level. In this case, the change of the signal at the trigger terminal is limited by a stray capacitance $C_{01}$ of this trigger terminal, i.e., the output terminal of the buffer amplifier circuit, and hence, the signal level having appeared at the trigger terminal on account of the interference does not immediately decrease. As a result, when the trigger signal period differs, the trigger level changes because the signal level having been caused at the trigger terminal by the interference differs.

In this embodiment, the interference with the feedback terminal by the trigger terminal is diminished by the combining circuit as described previously. As illustrated in FIG. 1, the output terminal of the monostable multivibrator circuit is connected to the collector of the differential transistor $Q_{37}$, and it is separated from the feedback terminal. Accordingly, the trigger signal does not leak to the output terminal through the feedback terminal.

The emitter-follower transistors of the combining circuit 4 have sufficiently low output impedances, and can accordingly make the rising rate of the composite signal sufficiently high. In case where the trigger terminal and the feedback terminal are directly connected, stray capacitances $C_{01}$ to $C_{03}$ including the collector capacitances of the transistors $Q_3$, $Q_{15}$ and $Q_{36}$, etc. will be combined at the direct connection point and will give a comparatively large value. The emitter-follower transistors of the combining circuit 4 make the capacitances independent of one another. Therefore, the respective capacitances of the trigger terminal and the feedback terminal remain small, and the signal changes at these terminals can be made sufficiently rapid.

According to the foregoing embodiment of this invention, the pulse signal having a fixed pulse width can be obtained. Therefore, in case where the monostable multivibrator of this invention is applied to the FM detector circuit of the pulse count system, a voice signal of very little distortion can be reproduced. More specifically, the pulse signals always having the fixed pulse width $\tau$ as shown in FIG. 2I can be obtained in synchronism with the phases of the respective periods of the FM modulation signal as shown in FIG. 2A. Therefore, by integrating the pulse signals with the low-pass filter circuit 15, the transmitted voice signal can be reproduced at high fidelity.

This invention is particularly effectively applied when the additional inversion output circuit 6 is required in the positive feedback circuit in case where the amplifier circuit 12 to be driven by the time constant circuit 10 delivers the phase inversion output to the positive feedback circuit, that is, where the collector output of the transistor $Q_{36}$ is delivered to the positive feedback circuit. The reason is that the emitter-follower circuit which includes the pair of transistors $Q_{10}$ and $Q_{13}$ having the effects as stated above and providing the in-phase outputs is applicable to the trigger signal input circuit (combining circuit) 4 and that the emitter-follower circuit which exhibits the low output impedance and which has the in-phase output characteristic is usable as the driver circuit of the time constant circuit 10.

What is claimed is:

1. In a monostable multivibrator circuit having: a time constant circuit which includes a capacitor; an amplifier circuit connected to receive an output signal of the time constant circuit; a positive feedback circuit which is connected between an output of said amplifier circuit and an input of said time constant circuit and which comprises a pair of differential transistors, a constant-current circuit including a constant-current transistor the collector of which is connected to the emitters of said pair of differential transistors and a load resistor connected to the collector of one of the pair of differential transistors, means for supplying the base of said one of said pair of differential transistors with an output signal from the output of said amplifier circuit and means for transmitting the voltage at said load resistor to said input of said time constant circuit; and trigger input terminal means coupled to a circuit loop including said time constant circuit, said amplifier circuit and said positive feedback circuit and to which a trigger signal is applied, characterized in that clamp circuit means is coupled to said one of the differential transistors for clamping the collector potential of said one of said differential transistors to a value higher than the base input potential thereof, wherein said constant-current circuit includes means for setting the constant collector current of said constant-current transistor and the resistance of said load resistor is set so that the falling rate of the voltage at said load resistor during a change of said one of said pair of differential transistors from a non-conductive state to a conductive state is higher than the rising rate of the voltage at said load resistor during a change thereof from a conductive state to a non-conductive state, whereby said monostable multivibrator circuit is triggered by a leading edge in a change of the voltage at said load resistor from a non-conductive state of said one of said pair of differential transistors to a conductive state thereof.

2. A monostable multivibrator circuit according to claim 1, wherein said clamp circuit means includes means for clamping a collector output potential of said one of said pair of differential transistors in its conductive state at a first predetermined potential higher than the base input potential thereof, and means for clamping the collector output potential of said one of said pair of differential transistors in its non-conductive state at a second predetermined potential higher than said first predetermined potential, both said means being coupled to a collector of said one of said pair of differential transistors in said positive feedback circuit.

3. A monostable multivibrator circuit according to any of claims 1, 2 or 4, wherein the trigger signal of a period corresponding to a frequency of an FM signal is applied to said trigger input terminal means, thereby to provide a pulse signal of a duty ratio corresponding to said frequency of said FM signal.

4. A monostable multivibrator circuit according to claim 1, wherein a first emitter-follower transistor circuit made up of a signal amplifying transistor is inserted between said load resistor and said input of said time constant circuit so that said monostable multivibrator is triggered when an output of said first emitter-follower transistor circuit is changed in a direction of increasing the emitter current thereof in accordance with said leading edge in said change of said voltage at said load resistor from the non-conductive state of said one of said pair of differential transistors to the conductive state thereof.

5. A monostable multivibrator circuit according to claim 4, wherein said positive feedback circuit further comprises a second emitter-follower transistor circuit which is coupled between said output of said amplifier circuit and said base of said one of said pair of differential transistors and to which said trigger input terminal means is coupled.

* * * * *